(12) United States Patent
Kitamura

(10) Patent No.: US 6,674,864 B1
(45) Date of Patent: Jan. 6, 2004

(54) ADAPTIVE SPEAKER COMPENSATION SYSTEM FOR A MULTIMEDIA COMPUTER SYSTEM

(75) Inventor: John S. Kitamura, Toronto (CA)

(73) Assignee: ATI Technologies, Ontario (CA)

( * ) Notice: Subject to any disclaimer, the term of this patent is extended or adjusted under 35 U.S.C. 154(b) by 0 days.

(21) Appl. No.: 08/997,031

(22) Filed: Dec. 23, 1997

(51) Int. Cl.[7] .................. H03G 5/00; H04R 29/00
(52) U.S. Cl. .................. 381/103; 381/98; 381/59; 381/99
(58) Field of Search .................. 381/103, 96, 98, 381/59, 100, 99, 55, 949

(56) References Cited

U.S. PATENT DOCUMENTS

| | | | | |
|---|---|---|---|---|
| 4,064,364 A | | 12/1977 | Veale .................. 369/4 |
| 4,152,649 A | | 5/1979 | Choquet .................. 375/231 |
| 4,352,190 A | | 9/1982 | Hullwegen .................. 333/18 |
| 4,769,848 A | | 9/1988 | Eberbach .................. 381/97 |
| 4,910,779 A | | 3/1990 | Cooper et al. .................. 381/26 |
| 5,129,006 A | * | 7/1992 | Hill et al. .................. 381/100 |
| 5,226,089 A | * | 7/1993 | Yoon et al. .................. 381/96 |
| 5,283,819 A | | 2/1994 | Glick et al. .................. 379/93.28 |
| 5,412,691 A | | 5/1995 | Ginzburg et al. .................. 375/296 |
| 5,438,623 A | | 8/1995 | Begault .................. 381/17 |
| 5,511,129 A | * | 4/1996 | Craven et al. .................. 381/103 |
| 5,568,560 A | * | 10/1996 | Combest .................. 381/99 |
| 5,583,560 A | | 12/1996 | Florin et al. .................. 704/275 |
| 5,594,509 A | | 1/1997 | Florin et al. .................. 348/565 |
| 5,602,928 A | | 2/1997 | Eriksson et al. .................. 381/71.4 |
| 5,617,480 A | * | 4/1997 | Ballard et al. .................. 381/98 |
| 5,745,586 A | * | 4/1998 | Tagami et al. .................. 381/103 |
| 5,812,685 A | * | 9/1998 | Fujita et al. .................. 381/90 |
| 5,832,438 A | * | 11/1998 | Bauer .................. 381/98 |
| 5,881,103 A | * | 3/1999 | Wong et al. .................. 381/103 |
| 5,983,087 A | * | 11/1999 | Milne et al. .................. 381/103 |
| 6,195,435 B1 | * | 2/2001 | Kitamura .................. 381/98 |
| 6,359,987 B1 | * | 3/2002 | Tran et al. .................. 381/58 |

\* cited by examiner

Primary Examiner—Minsun Oh Harvey
Assistant Examiner—Laura A. Grier
(74) Attorney, Agent, or Firm—Vedder, Price, Kaufman & Kammholz, P.C.

(57) ABSTRACT

An adaptive speaker compensation system and method, such as for use in a multimedia computer, stores speaker response filter coefficients for each speaker and adaptively compensates received audio for non-linear speaker characteristics based on the stored speaker response filter coefficients. The speaker response filter coefficients preferably represent an inverse response of a speaker response curve for each speaker in the audio system. Preferably a library memory containing prestored speaker characteristic data, such as the speaker response filter coefficients, is selectively accessed by the adaptive speaker compensation system to download the speaker response filter coefficients based on identification of a speaker type and channel for which the speaker is being used.

17 Claims, 4 Drawing Sheets

ADAPTIVE SPEAKER COMPENSATION SYSTEM FOR A MULTIMEDIA COMPUTER SYSTEM

BACKGROUND OF THE INVENTION

The invention relates generally to computer based audio control systems and more particularly to computer based audio control systems utilizing adaptive speaker compensation, such as in multimedia computers.

With the increased video and audio applications in multimedia personal computers, audio sound systems are becoming an increasingly important component of computer based systems. Computer users often upgrade their systems with new multimedia computer applications and may wish to add additional speakers or upgrade to higher performance speakers to take advantage of more sophisticated video and audio applications. Speaker response characteristics affect the quality of the audio systems. Speaker response characteristics depend upon many factors including overall speaker design, speaker material, manufacturing variations and other factors. An input audio signal to speakers can be distorted by the speaker due to the non-linear speaker response characteristics. Lower cost speakers typically have larger non-linear response characteristics and thus have more distortion. More expensive speakers typically have fixed built-in circuitry in the speaker cabinet to attempt to compensate for such non-linear response characteristics.

Some speakers use multiple speakers (speaker cones) within the same speaker box such as a mid range speaker, a bass speaker and a treble speaker. Many speaker manufacturers attempt to compensate for the non-linear speaker response characteristics by incorporating crossover filters directly into the speaker cabinet. Generally, crossover filters separate frequency ranges for each speaker of a cone within a multi speaker arrangement in an attempt to compensate for the non-linear response characteristics of each speaker. Such circuitry can become very complex and costly and adds to the expense of the speakers. Other filtering circuits are also typically incorporated into the speaker cabinet to ensure proper signal phase adjustment to avoid signal cancellation when multiple speakers are in the same cabinet. Where the level of compensation offers a higher quality sound, such built-in compensation circuitry can add substantial cost to the speaker and hence to the audio system.

Even less expensive speakers, such as headphone speakers, may have simple low frequency amplifiers built into the headphones. Such amplifiers typically boost bass frequencies, or other frequency ranges in an attempt to compensate for the non-linear characteristics of the headphone speakers. Although some compensation is provided, the level of compensation is often low due to the relatively simple compensation provided.

A problem arises with using such conventional speaker compensation systems because the old speakers must be replaced with new more expensive higher quality models. Also, adding new speakers with high cost built-in compensation can significantly increase the cost of the audio system.

Some high end home entertainment systems have multi-channel audio systems, such as surround sound systems with three or more channels to provide theater sound effects. The surround sound channels are often presented at a lower volume level than front channels since movies contain most of the audio information in the front channels and use the surround channels sparingly as effects channels. A typical surround multichannel system may include six channels. These channels typically consist of a left, right and center front channel, a left and right surround channel and a subwoofer channel. Differing prerecorded equalization settings among surround channel recordings or among various formats can sound different on the same speakers and different on other speakers not having crossover filtering or only having limited bandpass filtering.

However such systems typically require the purchase of new speakers with built-in compensation. In addition, the cost of high quality speakers containing non-linear response compensation can limit the market for such speakers due to the high manufacturing cost and high overall product cost. With the market demand of maintaining a cost competitive computer audio system, a need exists for a computer based speaker compensation system that affords high performance at a relatively low cost and one that provides increased flexibility to allow adaptive compensation when interchanging or adding speakers within a system. Such a method and system should provide adaptive crossover filtering and compensate for non-linear speaker characteristics for speakers with single or multiple speakers in a cabinet, if needed. Such a system should provide adaptive speaker compensation such that the system may automatically provide differing filters on a per speaker basis in a relatively simple and cost effective manner.

BRIEF DESCRIPTION OF THE DRAWINGS

The features of the present invention together with the advantages thereof, may be understood by reference to the following description taken in conjunction with the accompanying drawings wherein.

DETAILED DESCRIPTION OF THE INVENTION

An adaptive speaker compensation system and method, such as for use in a multimedia computer, stores speaker response filter coefficients for each speaker and adaptively compensates received audio for non-linear speaker characteristics based on the stored speaker response filter coefficients. The speaker response filter coefficients preferably represent an inverse response of a speaker response curve for each speaker in the audio system. Preferably a library memory containing prestored speaker characteristic data, such as the speaker response filter coefficients, is selectively accessed by the adaptive speaker compensation system to download the speaker response filter coefficients based on identification of a speaker type and channel for which the speaker is being used. The prestored speaker characteristic data is used to update compensation filtering in response to changes in the speaker types so that a new speaker being added to a system or one being replaced by a different speaker may have adaptive non-linear characteristic compensation applied by simply downloading prestored data and configuring onboard filters to apply filtering to each speaker with corresponding filter coefficients.

Figure 1:
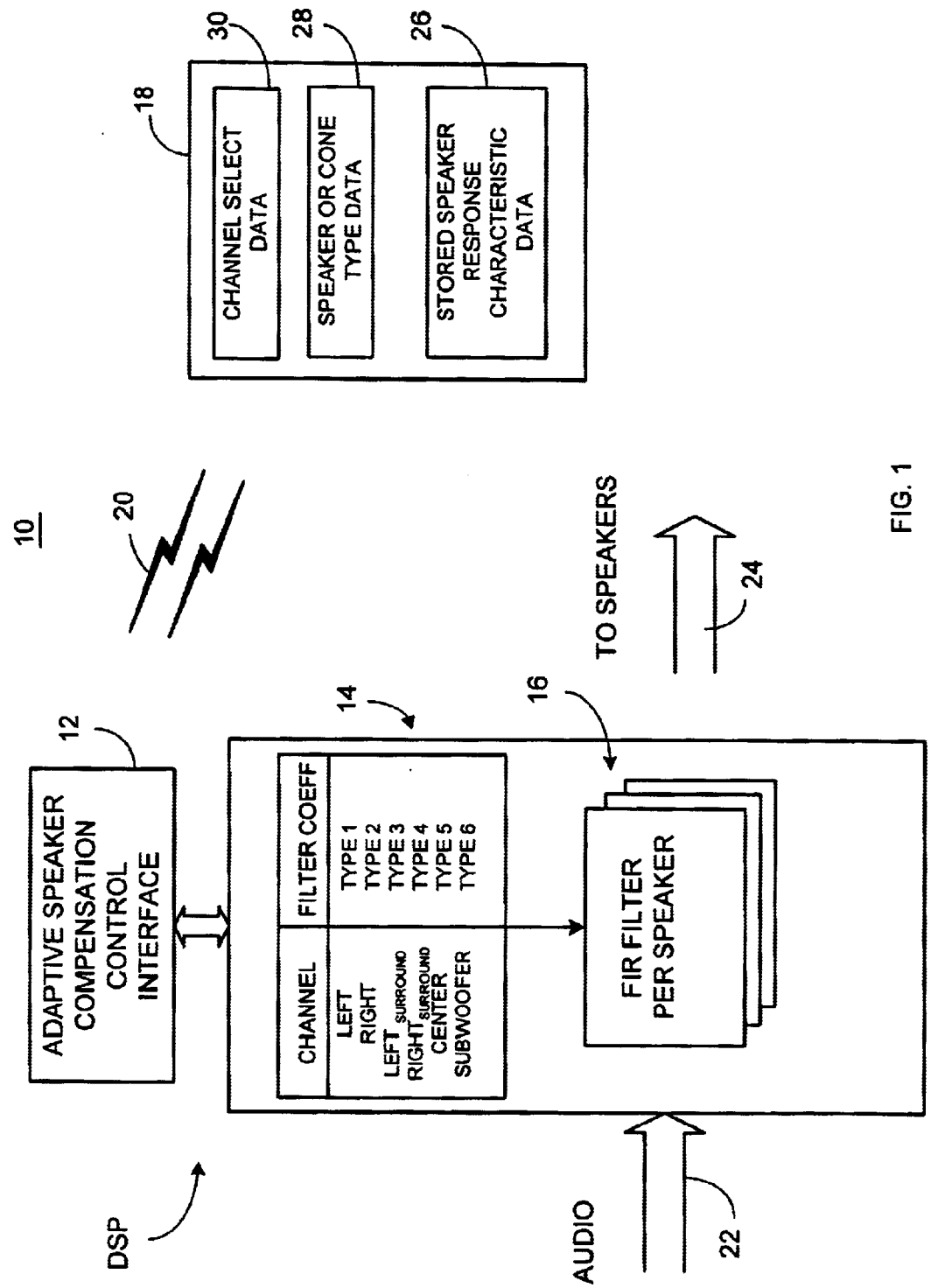
FIG. 1 is a block diagram generally depicting one embodiment of an adaptive speaker compensation system in accordance with the invention.

FIG. 1 shows an adaptive speaker compensation system 10 as applied to a system having speakers wherein a single speaker resides in a given speaker cabinet (e.g. one cone per speaker) in this example, the audio system is a multichannel system, such as a surround sound system. However it will be recognized that any suitable audio system may benefit from the herein described adaptive speaker compensation system. The adaptive speaker compensation system 10 includes an adaptive speaker compensation control interface 12, such as a graphic user interface, an adaptive compensation memory 14 such as memory associated with a digital signal processor, and a multichannel adaptive compensation stage 16, such as a set of programmable finite impulse response filters wherein one filter is provided for each speaker or channel. The adaptive speaker compensation system 10 also includes library memory 18 such as a remote database that may be accessible via communication link 20 through the adaptive speaker compensation control interface 12. The library memory 18 may be for example a database accessible via a global network, such as the Internet.

The adaptive compensation memory 14 preferably includes a table containing sets of filter coefficients for each speaker type wherein the filter coefficients represent an inverse response of the corresponding speaker response curve. As shown, there is a different set of filter coefficients for each speaker associated with each multichannel. In addition, there is a separate FIR filter for each channel in adaptive compensation stage 16. The speaker response filter coefficients stored in the adaptive compensation memory table 14 are obtained by the adaptive speaker compensation control and interface 12 from the library memory 18 on an as needed basis. The FIR filters in the adaptive compensation stage 16 are loaded with the corresponding filter coefficients and each set of filter coefficients corresponds to an inverse response curve of a corresponding speaker to which the audio is directed. Digital input audio signal 22 serves as input to the FIR filter stage 16 which compensates the received input audio for non-linear speaker characteristics based on the stored speaker response filter coefficients from the adaptive compensation memory table 14. The filter stage 16 performs filtering on each audio sample for each channel based on the following formula, as known in the art:

$$y(t) = \sum_{i=0}^{N-1} x(i) * coeff(i)$$

where N=the number of coefficients, x(i) is one digital audio sample from one channel of audio and coeff(i) is the corresponding filter coefficient. The compensated output 24 is then sent to each of the speakers.

The library memory 18 stores speaker response characteristic data 26 which preferably is speaker response filter coefficients representing an inverse response of each speaker response curve on a per speaker basis. However the stored speaker response characteristic data 26 may be any suitable data from which the speaker response filter coefficients may be derived. The library memory 18 also includes speaker (or cone) type data 28, such as data representing a manufacturer identification number. The library memory 18 also includes channel select data 30 such as data representing whether the speaker type is designated for the left/right/center subwoofer or other particular channel of the audio system. The channel select data 30, speaker type data 28 and stored speaker response characteristic data 26 is preferably prestored data at a remote location wherein the data may be prestored by a series of manufacturers or other source so that multiple computer users may access the common storage location of this information from the remote site. The library memory 18 is preferably accessible through a graphic user interface (not shown) on a coefficient library unit, such as a server or other processing unit. The graphic user interface may be a Windows™ based interface which allows selection of suitable data to effect adaptive compensation by the adaptive speaker compensation system 10. The data is preferably, but not limited to the channel type data 30 and the speaker type data 28 through the use of buttons, pull down menus or other graphic user configuration so that the adaptive speaker compensation system 10 may obtain different stored speaker response characteristic data 26 for different speakers as they are connected to the audio system.

Figure 2:
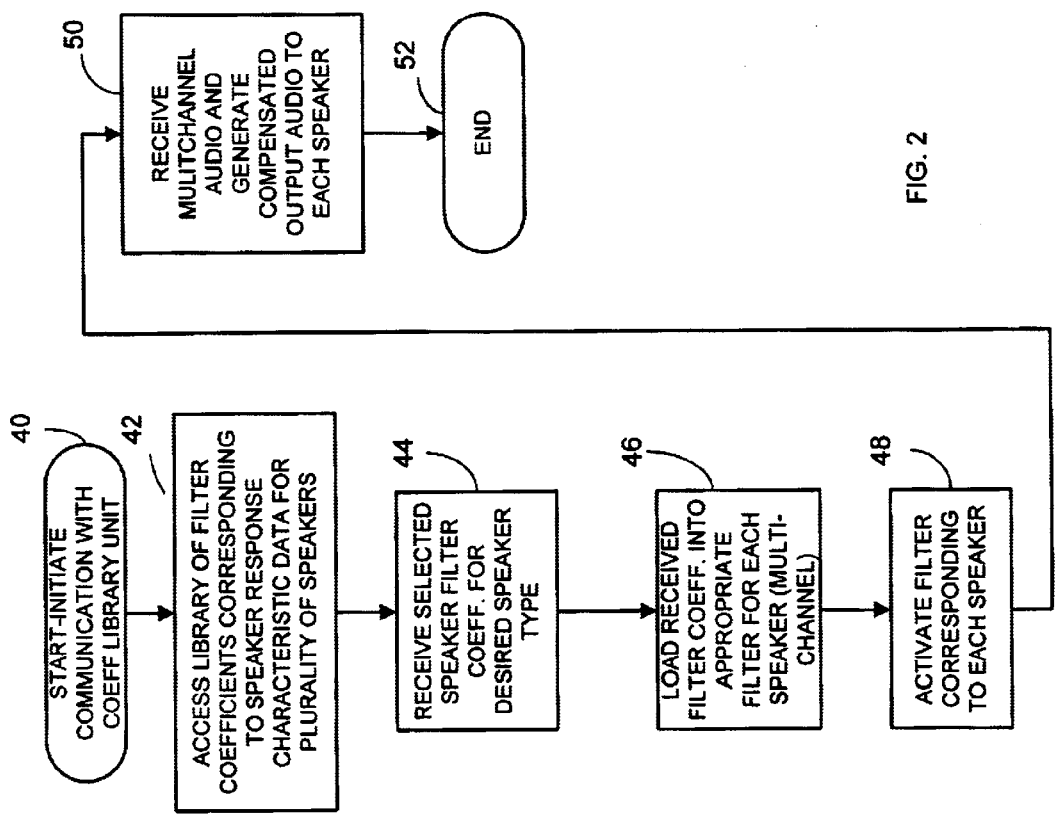
FIG. 2 is a flowchart generally depicting one embodiment of the operation of the adaptive speaker compensation system shown in FIG. 1.

FIG. 2 shows the operation of the adaptive speaker compensation system 10 wherein the adaptive speaker compensation control interface 12 initiates communication with the coefficient library unit 18. This is shown in block 40. Through the adaptive speaker compensation control interface 12, a user of the adaptive speaker compensation system 10 obtains the library of the filter coefficients corresponding to the speaker response characteristic data for the plurality of speakers in the audio system as shown in block 42. This is done through the interface of the coefficient library unit computer to allow a user to select a channel such as left channel, which becomes the channel select data 30 and to select the speaker type such as a particular speaker model number and manufacturer which is speaker type data 28. The coefficient library unit then locates the corresponding stored speaker response characteristic data in its database associated with the speaker type data 28.

As shown in block 44, the stored speaker response characteristic data 26 associated with the speaker (cone) type data 28 is transmitted over link 20 to the adaptive speaker compensation control interface 12 where the host multimedia computer receives the selected speaker coefficients for the desired speaker type. As shown in block 46, a digital signal processor stores the filter coefficients in the adaptive compensation memory table 14. The digital signal processor may be any suitable processor such as the host central processing unit of the host multimedia computer or a separate processor on an audio compensation control card. The digital signal processor then loads the received filter coefficients into the appropriate programmable filter for each speaker as shown in block 46. Hence the digital signature processor modifies filter configurations based on speaker characteristic data obtained from the library memory. The digital signal processor then activates the filter corresponding to each speaker to provide non-linear compensation based on the speaker response filter coefficients as shown in block 48. The programmed filters 16 receive the samples of multichannel audio 22 and generate the compensated output audio to each speaker 24 as shown in block 50. The adaptive speaker compensation system 10 then continues to filter the received multichannel audio data using the same filter coefficients for each corresponding speaker until a user decides to change a speaker or add other speakers and requests additional or different stored speaker response characteristic data 26 from the library memory 18. This is shown in block 52.

Hence, speakers can be used without having built-in compensation circuitry thereby reducing the cost of the audio system. Moreover, the adaptive speaker compensation system 10 readily adapts to provide varying compensation for nonlinear speaker responses when speakers are added or removed to the audio system.

Figure 3:
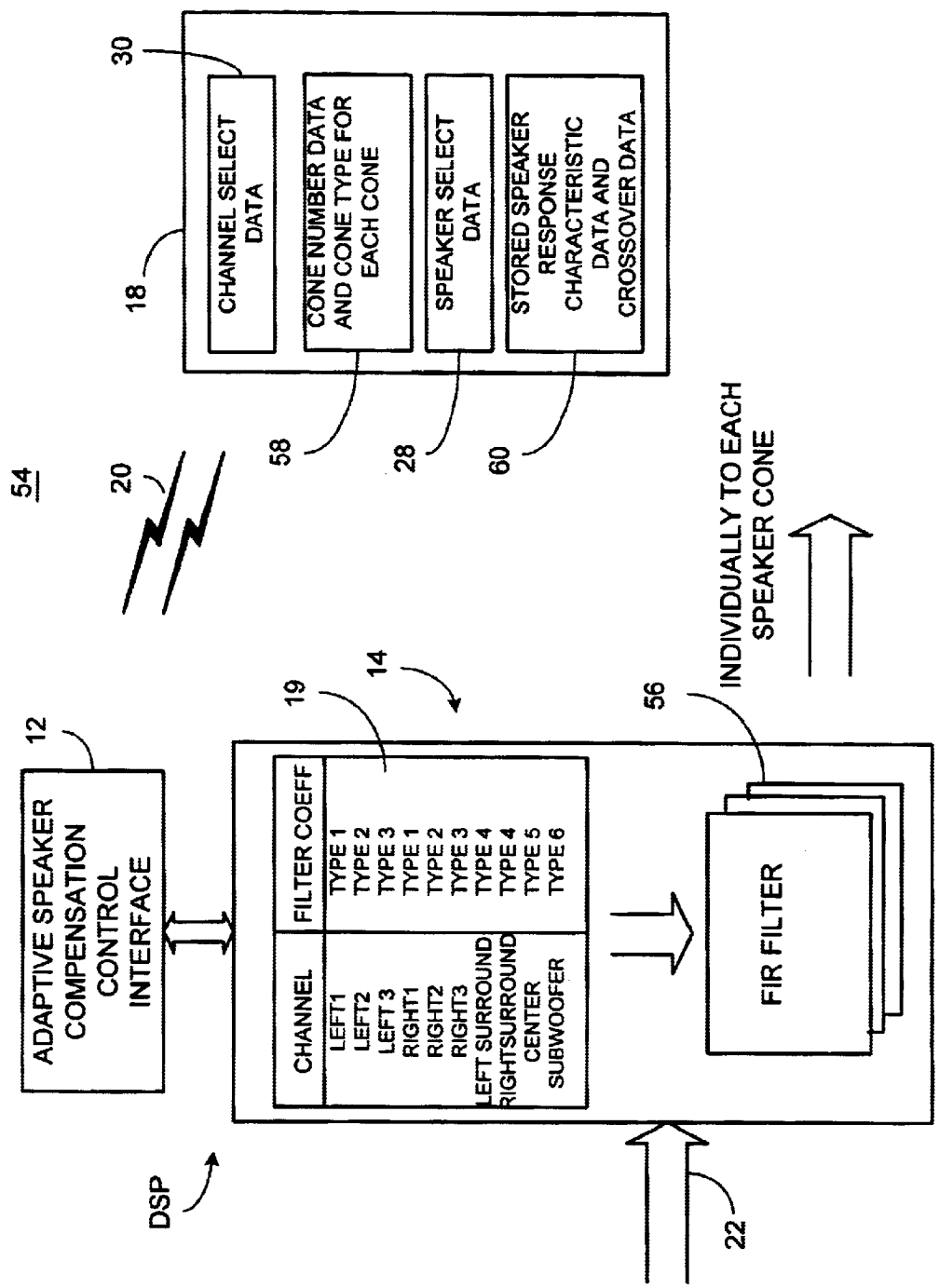
FIG. 3 is a block diagram generally depicting one embodiment of an adaptive speaker compensation system for use with speakers containing a plurality of speakers within the same cabinet.

FIG. 3 is another embodiment of an adaptive speaker compensation system 54, but in addition provides adaptive crossover filtering to facilitate frequency separation on a per speaker basis where a speaker includes multiple speakers within a same cabinet. In the example shown, there are three cones or speakers in a speaker cabinet for the left and right channels. The structure of the adaptive speaker compensation system 54 is substantially similar to that of the adaptive speaker compensation system 10 shown in FIG. 1 except for the use of the additional filter sets corresponding to the additional speakers within each speaker cabinet and the additional filters required for other additional speakers. In addition, crossover control data is used to facilitate crossover filtering. Hence the adaptive compensation memory table 14 includes additional memory for storing more filter coefficients sets and crossover control data. The crossover control data 60 is also stored in the coefficient library memory 18.

The adaptive speaker compensation system 54 includes a filter with crossover control data 56. Crossover control data is data that defines the frequency range wherein signals will be transferred or "crossed over" from one speaker cone to another. Crossover control data defines the frequency range as well as the type of curve or rolloff characteristics that the filter should have over the defined frequency range. Like the library of filter coefficients, the crossover control data is prestored by speaker manufacturers. The coefficient library unit 18 is substantially the same as that shown in FIG. 1 except for the addition of the speaker number data 58 indicating whether it is speaker one, two or three within a left or right channel. hence a user when accessing the coefficient library unit 18 is given a choice by the coefficient library unit interface to select a channel such as left or right channel along with the number of speakers associated with each channel and the type of cone by manufacturer number. If desired the speaker select data 28 automatically sets the number of speakers and selects speakers types as well as incorporating crossover data into the filter characteristics where the speaker select data is prestored by speaker manufacturers or other source. For example, the prestored data indicates that a single speaker cabinet employs a predefined number of cones of a predetermined type. However where such data is not prestored, but a per cone speaker response characteristic data and crossover data is employed, the cone number data and cone type data 58 may be entered.

Figure 4:
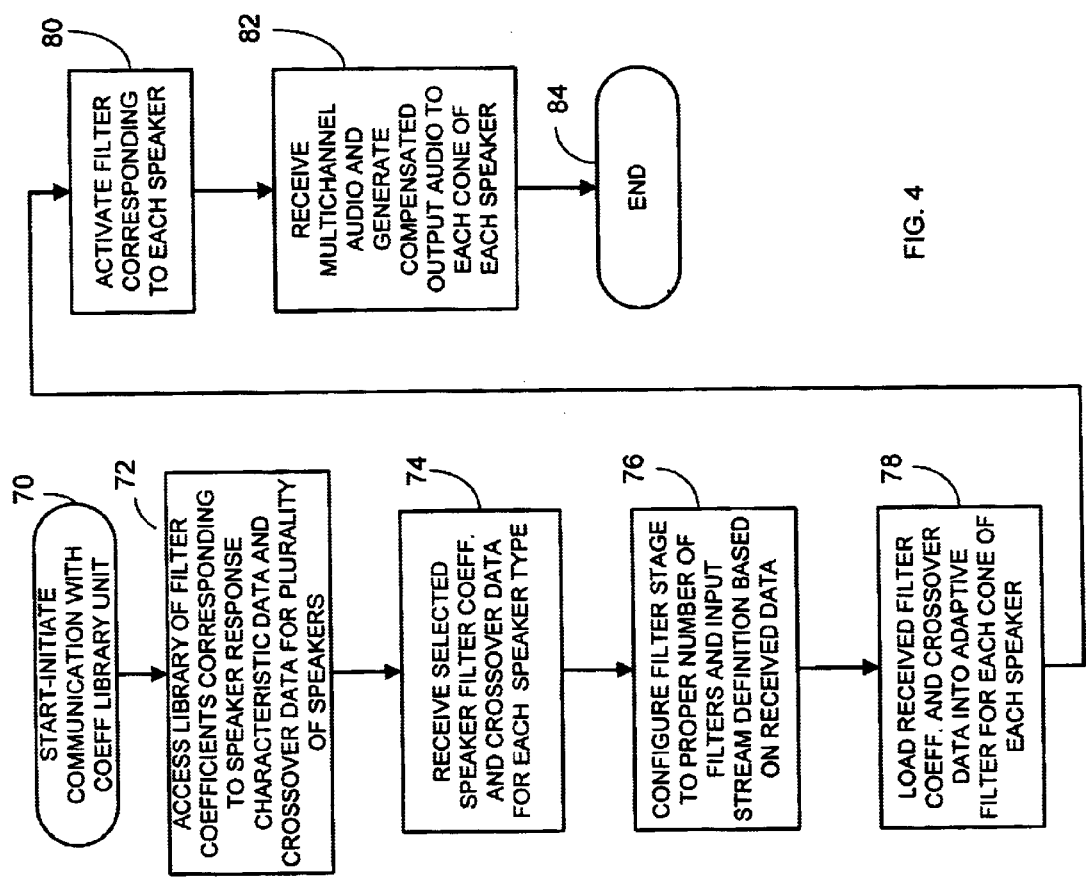
FIG. 4 is a flowchart generally depicting the operation of the system shown in FIG. 3.

FIG. 4 shows one example of the operation of the speaker compensation system 54 which starts by initiating communication with the coefficient library unit 18 as shown in block 70. As previously described with reference to FIG. 2, this is facilitated through the adaptive speaker compensation control interface 12. Once communication is established, the adaptive speaker compensation control interface 12 accesses the library of the filter coefficients corresponding to the speaker response characteristic data and the crossover data for the plurality of speakers corresponding to the speaker type data selected for the corresponding speaker as shown in block 72. The stored speaker response characteristic data and crossover data 60 is then received for each speaker type and stored in the adaptive compensation memory table 19 as shown in block 74. The digital signal processor configures filter and crossover control stages 76 to the proper number of filters and input stream definition based on the received speaker response characteristic data and crossover data 60. The digital signal processor (DSP) then loads the received filter coefficients and crossover data into the adaptive filters for each cone of each speaker as shown in block 78. The DSP then activates the filtering process corresponding to each speaker as shown in block 80. With the coefficients and crossover control data loaded into the filtering stages 56, the programmable filters with crossover control data stages 56 generate compensated output audio for each cone of each speaker as shown in block 82.

The adaptive speaker compensation system 54 then continues to adaptively compensate the audio 22 until different speakers are selected or the existing speakers are changed from one channel to another on the existing system as shown in block 84. The digital signal processor adaptively varies the filtering for each speaker in response to the stored speaker response coefficients. The filter with crossover control provides adaptive crossover filtering to facilitate frequency separation on a per speaker basis without requiring separate circuitry within each speaker thereby reducing system cost and improving flexibility to allow the same multimedia computer system to be connected with a variety of different speaker types and configurations. The DSP modifies the filter configurations based on the speaker characteristic data obtained from the library memory 18.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An adaptive speaker compensation system comprising:
    means for storing speaker response filter coefficients;
    means, operatively coupled to the means for storing, for adaptively compensating received audio for non-linear speaker characteristics based on the stored speaker response filter coefficients;
    a remotely accessible library memory means for storing speaker characteristic data;
    said means for adaptively compensating includes means, operatively coupled to the library memory means, for modifying filter configurations based on speaker characteristic data obtained from the library memory means;
    said library memory includes audio channel selection data and speaker type data to facilitate adaptive selection of speaker characteristic data on a per speaker basis; and
    said speaker characteristic data includes finite impulse response filter coefficients; and,
    said means for adaptively compensating, remotely accesses the library memory means to obtain the finite impulse response for filter coefficients for storage in the means for storing as speaker response filter coefficients.

2. A method for adaptive speaker compensation comprising the steps of:
    storing speaker response filter coefficients for a plurality of speakers, each representing an inverse response of a speaker response curve for said plurality of speakers, on a per speaker basis;
    adaptively compensating received audio for non-linear speaker characteristics based on the stored speaker response filter coefficients;
    storing speaker characteristic data in library memory that includes audio channel selection data and speaker type data to facilitate adaptive selection of speaker characteristic data on a per speaker basis, and
    modifying filter configurations based on speaker characteristic data obtained from the library memory.

3. The method of claim 2 wherein adaptively compensating received audio includes adaptively varying filtering for each speaker in response to the stored speaker response filter coefficients.

4. The method of claim 2 wherein adaptively compensating includes providing adaptive crossover filtering to facilitate frequency separation on a per speaker basis.

5. The method of claim 2 wherein the speaker characteristic data includes finite impulse response filter coefficients, the library memory is remotely accessible and adaptively compensating includes remotely accessing the library memory to obtain the finite impulse response filter coefficients for storage as speaker response filter coefficients for storage as speaker response filter coefficients.

6. An adaptive speaker compensation apparatus comprising:
   an interface to communicate remotely with an adaptive speaker compensation unit; and
   a filter coefficient library for storing audio selection data and speaker type data to facilitate adaptive selection of speaker filter characteristic data on a per speaker basis, said filter coefficient library being comprised of sets of filter coefficients for each speaker type and being remotely located from speakers themselves.

7. The system of claim 6 wherein the speaker characteristic data includes finite impulse response filter coefficients, the library memory is remotely accessible and the means for adaptively compensating remotely accesses the library memory means to obtain the finite impulse response filter coefficients for storage in the means for storing as speaker response filter coefficients.

8. A method of adaptive speaker compensation comprising the steps of:
   storing speaker response filter coefficients for a plurality of different speakers in a library memory that includes audio channel selection data and speaker type data to facilitate adaptive selection of speaker characteristic data on a per speaker basis; and
   adaptively compensating received audio for non-linear speaker characteristics of each speaker by providing adaptive crossover filtering based on stored speaker response filter characteristics to facilitate frequency separation on a per speaker basis and by modifying filter configurations based on speaker characteristic data obtained from the library memory.

9. The method of claim 8 wherein adaptively compensating received audio includes adaptively varying filtering for each speaker in response to the stored speaker response filter coefficients.

10. The method of claim 8 wherein adaptively compensating received audio includes communicating with library memory containing prestored speaker characteristic data to update compensation filtering in response to changes in speaker types.

11. The method of claim 8 wherein the speaker characteristic data includes finite impulse response filter coefficients, the library memory is remotely accessible and the step of adaptively compensating includes remotely accessing the library memory to obtain the finite impulse response filter coefficients for storage as speaker response filter coefficients.

12. An adaptive speaker compensation system comprising:
   library means for storing speaker response filter coefficients for a plurality of speaker types and for storing speaker characteristic data for a plurality of speaker type data to facilitate adaptive selection of speaker characteristic data on a per speaker basis, said library means further storing audio channel selection data and speaker type data; and
   means, operatively coupled to the library means for storing, for adaptively compensating received audio for non-linear speaker characteristics based on the stored speaker response filter coefficients, wherein the means for adaptively compensating received audio includes means for communicating with a library memory containing prestored speaker characteristic data to update compensation filtering in response to changes in speaker types and further includes means for modifying filter configurations based on speaker data obtained from the library means.

13. The system of claim 12 wherein the means for adaptively compensating includes means for providing adaptive crossover filtering to facilitate frequency separation on a per speaker basis.

14. The system of claim 12 wherein the means for adaptively compensating received audio includes means for adaptively varying filtering for each speaker in response to the stored speaker response filter coefficients.

15. The system of claim 12 wherein the filter coefficients are sets of filter coefficients for each speaker type.

16. A method of adaptive speaker compensation comprising the steps of:
   storing speaker characteristic data in library memory wherein the library memory includes audio channel selection data and speaker type data to facilitate adaptive selection of speaker characteristic data on a per speaker basis;
   storing speaker response filter coefficients; and
   adaptively compensating received audio for non-linear speaker characteristics based on the stored speaker response filter coefficients wherein compensating includes modifying filter configurations based on speaker characteristic data obtained from the library memory.

17. The method of claim 16 wherein the speaker characteristic data includes finite impulse response filter coefficients, the library memory is remotely accessible and the step of adaptively compensating includes remotely accessing the library memory to obtain the finite impulse response filter coefficients for storage as speaker response filter coefficients.

* * * * *